(12) United States Patent
Jeong et al.

(10) Patent No.: US 10,950,508 B2
(45) Date of Patent: Mar. 16, 2021

(54) ION DEPTH PROFILE CONTROL METHOD, ION IMPLANTATION METHOD AND SEMICONDUCTOR DEVICE MANUFACTURING METHOD BASED ON THE CONTROL METHOD, AND ION IMPLANTATION SYSTEM ADAPTING THE CONTROL METHOD

(71) Applicant: SAMSUNG ELECTRONICS CO., LTD., Suwon-si (KR)

(72) Inventors: Seongrak Jeong, Seoul (KR); Seungmo Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/711,771

(22) Filed: Dec. 12, 2019

(65) Prior Publication Data

US 2020/0303266 A1    Sep. 24, 2020

(30) Foreign Application Priority Data

Mar. 20, 2019  (KR) .................. 10-2019-0031909
Jun. 25, 2019  (KR) .................. 10-2019-0075785

(51) Int. Cl.

| H01L 21/66 | (2006.01) |
| H01L 21/265 | (2006.01) |
| G06N 3/08 | (2006.01) |
| C23C 14/48 | (2006.01) |
| C23C 14/54 | (2006.01) |
| G06N 3/04 | (2006.01) |
| H01J 37/317 | (2006.01) |

(52) U.S. Cl.
CPC .............. *H01L 22/26* (2013.01); *C23C 14/48* (2013.01); *C23C 14/542* (2013.01); *G06N 3/04* (2013.01); *G06N 3/08* (2013.01); *H01L 21/26513* (2013.01); *H01J 37/3171* (2013.01)

(58) Field of Classification Search
None
See application file for complete search history.

(56) References Cited

U.S. PATENT DOCUMENTS

| 5,737,496 | A | 4/1998 | Frye et al. |
| 7,528,389 | B2 | 5/2009 | Fang et al. |
| 8,501,499 | B2 | 8/2013 | Sundararajan et al. |
| 9,312,094 | B2 | 4/2016 | Akima et al. |
| 2017/0131084 | A1* | 5/2017 | Hung ............... G01B 11/002 |
| 2017/0193400 | A1* | 7/2017 | Bhaskar ............ G06N 3/0472 |

(Continued)

FOREIGN PATENT DOCUMENTS

| JP | H 08-139049 A | 5/1996 |
| KR | 10-1094598 B1 | 12/2011 |

*Primary Examiner* — Asok K Sarkar
(74) *Attorney, Agent, or Firm* — Lee IP Law, P.C.

(57) ABSTRACT

An ion depth profile control method includes performing reinforcement learning, whereby a similarity between an ion depth profile and a box profile is output as a reward when the similarity is equal to or greater than a set criterion, the ion depth profile being an ion concentration according to a wafer depth in an ion implantation process, and the box profile being a target profile, obtaining at least one process condition of the ion implantation process as a result of the reinforcement learning, and generating a process recipe regarding the at least one process condition.

20 Claims, 11 Drawing Sheets

(56) References Cited

U.S. PATENT DOCUMENTS

| | | |
|---|---|---|
| 2018/0330920 A1 | 11/2018 | Sasaki et al. |
| 2019/0051488 A1 | 2/2019 | Schustereder et al. |
| 2019/0066977 A1 | 2/2019 | Jelinek et al. |
| 2019/0074158 A1 | 3/2019 | Fujii et al. |
| 2019/0148246 A1* | 5/2019 | Zhan ................ H01L 22/20 438/14 |
| 2019/0294923 A1* | 9/2019 | Riley ................ G06T 7/001 |
| 2019/0347527 A1* | 11/2019 | Bhaviripudi ........... G06N 20/00 |
| 2020/0098544 A1* | 3/2020 | Meng ................ H01J 37/16 |
| 2020/0135470 A1* | 4/2020 | Huang ............. H01L 21/26586 |

\* cited by examiner

ION DEPTH PROFILE CONTROL METHOD, ION IMPLANTATION METHOD AND SEMICONDUCTOR DEVICE MANUFACTURING METHOD BASED ON THE CONTROL METHOD, AND ION IMPLANTATION SYSTEM ADAPTING THE CONTROL METHOD

CROSS-REFERENCE TO RELATED APPLICATION

Korean Patent Application No. 10-2019-0031909, filed on Mar. 20, 2019, in the Korean Intellectual Property Office, and Korean Patent Application No. 10-2019-0075785, filed on Jun. 25, 2019, in the Korean Intellectual Property Office, and entitled: "Ion Depth Profile Control Method, Ion implantation Method and Semiconductor Device Manufacturing Method Based On the Control Method, and Ion implantation System Adapting the Control Method," are incorporated by reference herein in their entirety.

BACKGROUND

1. Field

Embodiments relate to an ion implantation method of implanting ions into a wafer. More particularly, embodiments relate to an ion depth profile control method and an ion implantation method based on the control method.

2. Description of the Related Art

An ion implantation process of implanting ions into a wafer will be described briefly below. An ion source gas is ionized, and then required ions are selected and accelerated to form an ion beam. A desired amount of the ion beam is implanted into a surface of a wafer to bury the same in a crystal lattice in the wafer. The wafer may obtain an appropriate level of conductivity from the ions buried in the wafer. A depth at which ions are implanted into the wafer may vary according to ion energy. Ion energy may be determined by a potential difference applied between an ion beam apparatus and a wafer.

SUMMARY

According to an aspect of embodiments, there is provided an ion depth profile control method, including performing reinforcement learning, whereby a similarity between an ion depth profile and a box profile is output as a reward when the similarity is equal to or greater than a set criterion, the ion depth profile being an ion concentration according to a wafer depth in an ion implantation process, and the box profile being a target profile, obtaining at least one process condition of the ion implantation process as a result of the reinforcement learning, and generating a process recipe regarding the at least one process condition.

According to an aspect of embodiments, there is provided an ion implantation method including performing reinforcement learning whereby a similarity between an ion depth profile and a box profile is output as a reward when the similarity is equal to or greater than a set criterion, the ion depth profile being an ion concentration according to a wafer depth in an ion implantation process, and the box profile being a target profile, obtaining at least one process condition of the ion implantation process as a result of the reinforcement learning, generating a process recipe regarding the at least one process condition, and performing ion implantation on a wafer by applying the process recipe.

According to an aspect of embodiments, there is provided a method of manufacturing a semiconductor device, the method including performing reinforcement learning whereby a similarity between an ion depth profile and a box profile is output as a reward when the similarity is equal to or greater than a set criterion, the ion depth profile being an ion concentration according to a wafer depth in an ion implantation process, and the box profile being a target profile, obtaining at least one process condition of the ion implantation process as a result of the reinforcement learning, generating a process recipe regarding the at least one process condition, performing ion implantation on a wafer by applying the process recipe, and performing a subsequent semiconductor process on the wafer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
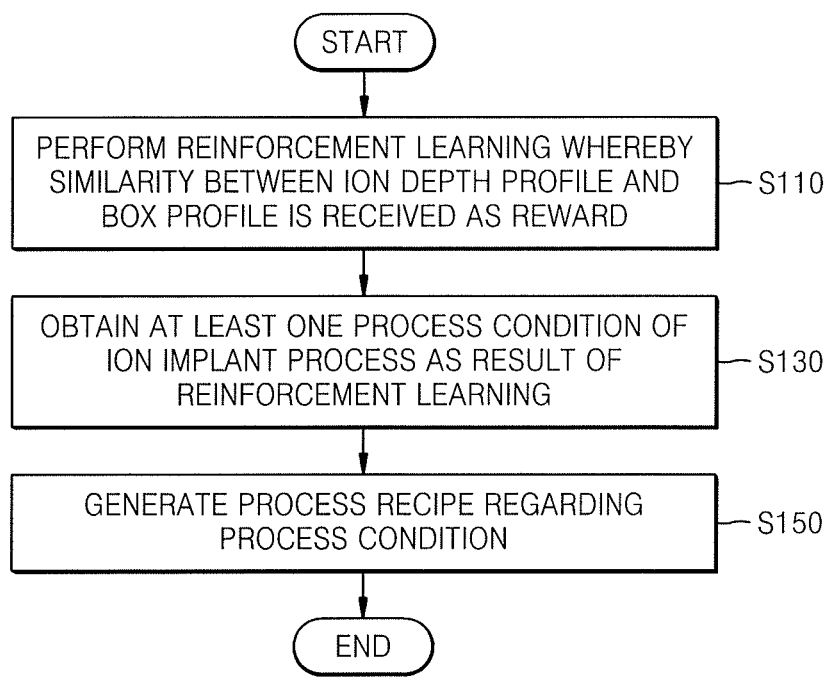
FIG. 1 illustrates a flowchart of an ion depth profile control method according to an embodiment.
Figure 2A:
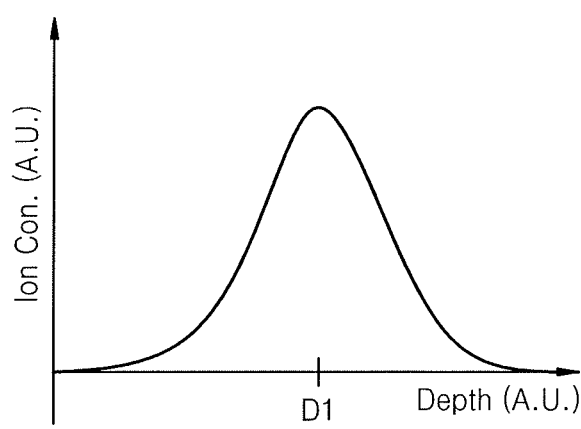
FIGS. 2A and 2B illustrate graphs showing an ion depth profile.
Figure 2B:

FIG. 1 is a flowchart of an ion depth profile control method according to an embodiment. FIGS. 2A and 2B are graphs showing an ion depth profile. In FIGS. 2A and 2B, the x-axis represents depth of a wafer in arbitrary units, and the y-axis represents ion concentration in arbitrary units. The depth of the wafer may be depth measured from a wafer surface or depth measured from a specific position within the wafer.

Referring to FIGS. 1 through 2B, in an ion depth profile control method according to the present embodiment, first, reinforcement learning is performed (S110). That is, in operation S110, a reinforcement learning is performed, until a similarity between an ion depth profile and a box profile is determined to be a reward. An ion depth profile refers to a profile of an ion concentration according to a wafer depth in an ion implantation process. A box profile refers to a target profile that an ion depth profile is to reach. Thus, as a high similarity between an ion depth profile and a box profile is desired (i.e., as a reward in the reinforcement learning), the reinforcement learning may be performed (i.e., operation S110) until a similarity between the ion depth profile (e.g., of a predetermined process) and a box profile (e.g., the required target profile) is equal to or greater than a set criterion, and is output as a reward.

In an ion implantation process, a depth at which ions are implanted into a wafer may vary according to ion energy. For example, with a relatively large ion energy, ions are implanted relatively deeply into a wafer, and with a relatively small ion energy, ions may be implanted relatively shallowly into a wafer.

In addition, when implanting ions into a wafer with fixed, single ion energy, an ion concentration according to a wafer depth may be shown as a Gaussian distribution, as illustrated in FIG. 2A. Referring to FIG. 2A, when ion implantation is performed with fixed, single ion energy, ions may be implanted mostly at a same depth, i.e., the ions may be concentrated mostly at a first depth D1 of a wafer. Thus, as illustrated in FIG. 2A, the ion concentration may have a Gaussian distribution in which the ion concentration is highest at the first depth D1 and decreases abruptly away from the first depth D1 in two directions.

In contrast, referring to FIG. 2B, when the ion energy is adjusted, e.g., non-fixed, during the ion implantation process, the ion concentration is controlled to have a uniform distribution over an entire region, e.g., an entire required depth, of a wafer. As such, the uniform distribution of the ion concentration may promote consistent performance in semiconductor devices produced in subsequent semiconductor processes. For example, as illustrated in FIG. 2B, a profile of the ion concentration may be constant over the entire region, e.g., the required depth, of the wafer to have a shape of a rectangular box profile.

Reinforcement learning is one of three areas of machine learning. For example, machine learning can be classified into supervised learning, unsupervised learning, and reinforcement learning. Reinforcement learning is a learning method in which an agent defined in a certain environment, e.g., a software program, perceives a current state, e.g., of the environment, and chooses, from among available actions, an action or an order of actions that maximizes reward. For example, in regard to the ion depth profile control method of the present embodiment, when the agent inputs the current state in an ion implantation process, e.g., state of ion concentration with respect to depth, and takes action according to a process condition calculated through learning, e.g., a process condition that affects the ion concentration with respect to depth, the environment returns the next state and reward to the agent, e.g., based on the previously chosen action, and the reward here may be a similarity between an ion depth profile and a box profile. For example, in operation S110, the reinforcement learning may be performed, e.g., ion concentration may be adjusted based on process conditions, until a profile of a measured ion concentration with respect to depth reaches a high similarity to the desired target box profile, e.g., based on the set criterion that determines that the reward is earned.

In the ion depth profile control method according to the present embodiment, the reinforcement learning may be performed in a simulation device (see 110 of FIG. 3), in which a corresponding algorithm or program may operate. For example, the simulation device may be a computer, e.g., a desktop, a workstation, a supercomputer, or the like, capable of executing algorithms or programs related to reinforcement learning. On the other hand, algorithms or programs related to reinforcement learning may include, e.g., a Deep Neural Network (DNN) algorithm or a Deep Q-Network (DQN) algorithm. Here, strictly speaking, DQN refers to a combination of reinforcement learning algorithm, e.g., a Q-Networks algorithm with a DNN algorithm. However, a reinforcement learning-related algorithm is collectively referred to as a DQN algorithm below. The algorithm related to reinforcement learning is not limited to the DQN algorithm. Reinforcement learning and DQN will be described in more detail with reference to FIGS. 5A to 6.

Next, referring back to FIG. 1, at least one process condition in the ion implantation process is obtained as a result of the reinforcement learning (S130). For example, the reinforcement learning may be performed until the at least one process condition, e.g., adjustment of ion energy over time, is determined as a process condition that provides the high similarity, e.g., based on the set criterion that determines that the reward is earned. In addition, by performing an ion implantation process based on the at least one process condition obtained through the reinforcement learning, an ion depth profile in the form of a box profile may be implemented.

The at least one process condition may be ion energy over time, which is an action of an agent in the reinforcement learning above. The at least one process condition is not limited to ion energy over time. For example, the at least one process condition may include other process conditions that may affect the implementation of an ion depth profile in the form of a box profile in an ion implantation process. As an example, as will be described in more detail below with reference to FIGS. 7A to 9B, the at least one process condition may include an angle of incidence of ions over time, a dose of ions over time, and a vertical movement speed of a wafer over time.

In the operation of obtaining the at least one process condition (S130), the at least one process condition may be generated in the form of a profile. For example, when the at least one process condition is ion energy over time, in the operation of obtaining at least one process condition (S130), an ion energy profile indicating magnitude of ion energy over time may be generated, e.g., in a form of a graph. In addition, when the at least one process condition is an angle of incidence of ions over time, a dose of ions over time, a vertical movement speed of a wafer over time, or the like, in the operation of obtaining at least one process condition (S130), an appropriate profile, e.g., an ion incidence angle profile, an ion dose profile, a vertical movement speed profile or the like, may be generated in accordance with each process condition.

Referring back to FIG. 1, after obtaining the at least one process condition, a process recipe regarding the process condition is generated (S150). Here, a process condition is a condition of an upper concept for performing an ion implantation process, and a process recipe corresponds to specific data or physical quantities for performing the process condition. For example, when the at least one process condition is determined in operation S130 as ion energy over time, e.g., with a generated desired ion energy over time profile, a process recipe including specific data or physical quantities that correspond to the generated profile of the ion energy over time in an ion implantation process is generated. For example, a process recipe may include, e.g., correspond to, specific quantitative data or physical quantities, e.g., a concentration of a source gas, a current amplitude, a voltage amplitude, a time interval, or the like, which are needed to generate the corresponding ion energy over time profile.

When a process recipe regarding a process condition is generated (i.e., operation S150), the process recipe may then be applied to actually perform an ion implantation process. For example, the simulated results of operation S150 in FIG. 1 may be applied in an ion implantation process implemented physical wafers and ion beams.

According to the ion depth profile control method of the present embodiment, at least one process condition in an ion implantation process may be obtained through reinforcement learning, and a process recipe regarding the corresponding process condition may be generated. Here, the at least one process condition obtained through reinforcement learning may be a process condition whereby an ion depth profile is made to substantially correspond to a box profile in an ion implantation process, and may be, e.g., an ion energy over time. Therefore, according to the ion depth profile control method of the present embodiment, the process recipe is applied to an ion implantation process, thereby implementing an ion depth profile in the form of a box profile in the ion implantation process.

In addition, in the ion depth profile control method of the present embodiment, an ion implantation process may be performed only once based on process conditions obtained through reinforcement learning and a process recipe according to the process conditions. Thus, time of the ion implantation process may be significantly reduced.

For reference, in order to convert an ion concentration depth profile to a box profile in an ion implantation process, e.g., without first obtaining a process recipe based on process conditions determined by reinforced learning, multiple ion implantation processes, while varying ion energy, would be required. For example, if a physical, i.e., non-simulated, ion implantation were to be performed with ion energy of E1, e.g., assuming a Gaussian distribution having a maximum ion concentration at the first depth D1, an ion implantation with each of an ion energy of E1−α and an ion energy of E1+α, would be required, e.g., with a corresponding Gaussian distribution having a maximized ion concentration at respective depths that are shallower and deeper than the first depth D1. Thus, when an ion implantation process is performed at least three times with corresponding three ion energies E1, E1−α, and E1+α, respectively, an ion depth profile may approximate a shape of a box profile to some extent. In addition, if an ion implantation process were to be performed with more types of ion energy and a number of times corresponding to the ion energies, an ion depth profile could be even closer to the shape of a box profile.

However, even if multiple types of ion energy were to be used in multiple ion implantation processes, respectively, it would have been difficult for an ion depth profile to exactly match a box profile. In addition, a process of using multiple ion implantations may take a very long time, e.g., sine several ion implantation processes have to be performed, thereby increasing overall production time. Moreover, while an ion implantation process is to maintain a set ion concentration in a desired area of a wafer, it may be difficult to match the ion concentration itself when multiple ion implantation processes are performed to match a box profile.

In contrast, according to the ion depth profile control method of the present embodiment, process conditions, whereby an ion depth profile is made to substantially match a box profile, are obtained through reinforcement learning, and a process recipe regarding the process conditions is generated to be applied to an ion implantation process. Therefore, according to the ion depth profile control method of the present embodiment, an ion depth profile in the form of a box profile may be realized in an ion implantation process through a single ion implantation process, thereby significantly reducing the time of the ion implantation process. In addition, as the process conditions are obtained such that the required ion concentration in the region is maintained, no additional process may be necessary to match the ion concentration.

Figure 3:
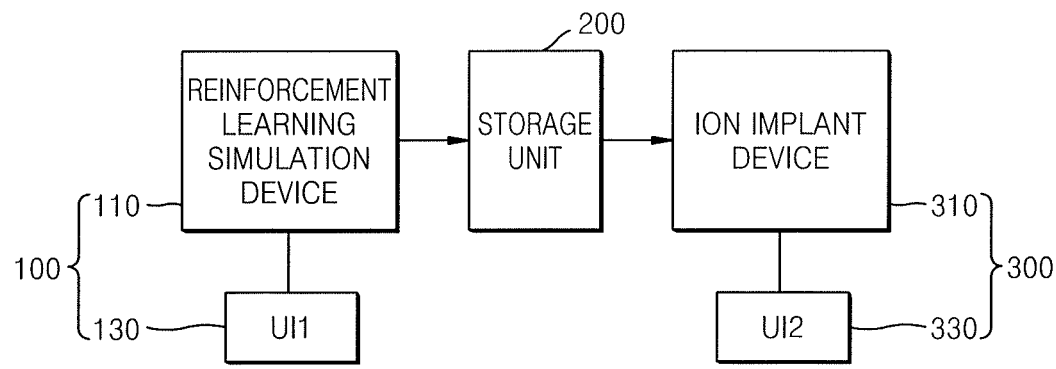
FIG. 3 illustrates an ion implantation system according to an embodiment.
Figure 4:
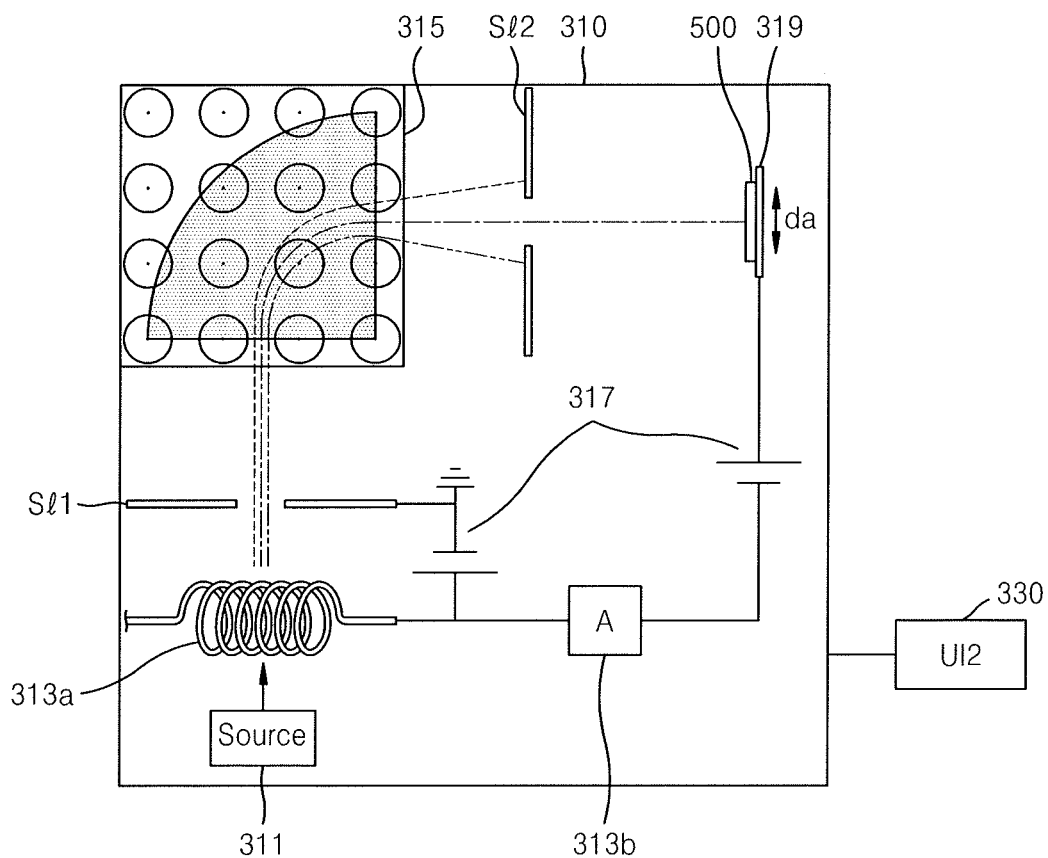
FIG. 4 illustrates an ion implantation device in the ion implantation system of FIG. 3.

FIG. 3 illustrates an ion implantation system 1000 according to an embodiment. FIG. 4 is a device structural diagram schematically illustrating an ion implantation device in the ion implantation system 1000 of FIG. 3.

Referring to FIGS. 3 and 4, the ion implantation system 1000 according to the present embodiment may include a reinforcement learning simulation device unit 100, a storage unit 200, and an ion implantation device unit 300.

The reinforcement learning simulation device unit 100 may include a reinforcement learning simulation device 110 and a first user interface (UI) 130. The reinforcement learning simulation device 110 may be a computer, e.g., a desktop computer, a workstation, a supercomputer, or the like, on which a learning algorithm for reinforcement learning may be executed. For example, the learning algorithm may be a DQN algorithm as described above.

The first UI 130 may be connected to the reinforcement learning simulation device 110. Variables, e.g., a discount factor, a learning rate, and an epoch, used in reinforcement learning may be manually or automatically set via the first UI 130. The discount factor, the learning rate, and the epoch will be described in more detail in the description with reference to FIGS. 5A to 6. In addition, a learning progress state in reinforcement learning may be debugged via the first UI 130. For example, by debugging the learning progress state via the first UI 130, a user may check the progress state of learning in real time via a computer monitor or the like.

The storage unit 200 may store data on at least one process condition in an ion implantation process, obtained through reinforcement learning by the reinforcement learning simulation device 110. For example, at least one process condition may be data about ion energy over time or data about an ion energy profile indicating the magnitude of ion energy over time.

The storage unit 200 may store data needed for the reinforcement learning simulation device 110 or data needed for an ion implantation device 310, without being limited to data about at least one process condition. In addition, the storage unit 200 may store data about intermediate results output from the reinforcement learning simulation device 110. According to an embodiment, the storage unit 200 may be arranged in the reinforcement learning simulation device 110 or the ion implantation device 310.

The ion implantation device unit 300 may include the ion implantation device 310 and a second UI 330. As illustrated in FIG. 4, the ion implantation device 310 may include an ion source 311, an ion generator 313a, a mass spectrometer 315, an accelerator 317, and a stage 319.

The ion source 311 may supply a source gas for ionization. The source gas may be variously selected according to the type of ions to be implanted, e.g., ions of boron (B), phosphorus (P), arsenic (As), and antimony (Sb) or the like.

For example, as an N-type dopant, $PH_3$ gas may be used as a source gas for phosphorus (P) ions, and as a P-type dopant, $BF_3$ gas may be used as a source gas for boron (B) ions.

The ion generator 313a may generate ions from the source gas. That is, the ion generator 313a may emit hot electrons, and the source gas may collide with the hot electrons to generate ions. For example, the ion generator 313a may be implemented using a filament. The number of generated ions is increased, as the number of hot electrons is increased, e.g., the number of hot electrons may be increased by applying more current to the filament through a current source 313b. That is, by adjusting a current amount via the current source 313b, i.e., to adjust the amount of emitted hot electrons, the amount, e.g., number, of generated ions may be adjusted. For example, the amount, e.g., number, of ions implanted into a wafer is referred to as a dose. According to an embodiment, the ion source 311, the ion generator 313a, and the current source 313b may be collectively referred to as an ion source. Ions generated using the ion generator 313a may enter the mass spectrometer 315 by passing through a first slit S1.

The mass spectrometer 315 may adjust a magnetic field strength to select ions to be implanted from among the ions from the ion generator 313a. The mass spectrometer 315 is also referred to as a classifier, and without the mass spectrometer 315, all ions generated from a source gas and other unwanted types of ions may be implanted into a wafer. Thus, the mass spectrometer 315 may be arranged to extract only those ions required for ion implantation. In more detail, the mass spectrometer 315 is a device for measuring mass by analyzing a path of ions passing through an electromagnetic field. The mass spectrometer 315 uses the fact that, when charged ions pass through an electric field or a magnetic field, the path of the ions is bent by an electromagnetic force, and also the fact that paths of ions having the same charge are bent less the greater the mass of the ions is. Thus, only needed ions may be extracted by adjusting a magnetic field of the mass spectrometer 315. For example, as shown in FIG. 4, only necessary ions may pass through a second slit S12, and other ions may be blocked by the second slit S12.

The accelerator 317 may accelerate ions to be implanted, to produce an ion beam having required ion energy. Charged particles are accelerated when placed in an area with a potential difference. For example, by allowing ions to pass through two points having a potential difference V, the final energy E of obtained ions is represented as E=qV. For example, when P+ ions are accelerated while passing through a potential difference of 150 kV, the ions may have an energy of 150 keV. A depth at which ions are incident to a wafer 500 varies according to ion energy as described above. As the accelerator 317 is a device that generates a potential difference between two locations through which ions pass, in FIG. 4, the accelerator 317 is simply represented as a voltage sources.

As further illustrated in FIG. 4, the wafer 500 is on the stage 319, such that ions emitted through the second slit S12 toward the stage 319 are implanted into the wafer 500. As further illustrated in FIG. 4, an upper surface of the stage 319 is disposed to be perpendicular to an ion beam, and accordingly, an upper surface of the wafer 500 disposed on the upper surface of the stage 319 is also perpendicular to the ion beam. In some embodiments, the stage 319 may be disposed such that the upper surface thereof has a certain inclination angle with respect to an ion beam, and accordingly, the ion beam may be obliquely incident on the upper surface of the wafer 500.

In general, in an ion implantation process, the stage 319 may move in a vertical direction as indicated by a two-way arrow (da). Ion implantation may be performed over the entire wafer 500 through the vertical movement of the stage 319 described above. In addition, in an ion implantation process, the wafer 500 reciprocates, e.g., moved, in the vertical direction via the stage 319, and the number of times of reciprocation may vary according to the type of the ion implantation process.

Although not shown, the ion implantation device 310 may further include a scanner, a dose controller, a Faraday cup, and the like. The scanner may be disposed at the rear of the accelerator 317 and may align an ion beam into a line-shaped ion beam to be uniformly implanted into the wafer 500. The dose controller may control a total amount of ions implanted into the wafer 500 based on data about an ion beam measured using the Faraday cup.

The second UI 330 may be connected to the ion implantation device 310. The at least one process condition described above may be set in the ion implantation device 310 in real time via the second UI 330. For example, ion energy over time may be manually or automatically set in the ion implantation device 310 via the second UI 330. Meanwhile, setting at least one process condition in the ion implantation device 310 may refer to applying process recipes regarding the at least one process condition. For example, setting ion energy over time in the ion implantation device 310 may correspond to applying specific quantitative data or physical quantities, e.g., a concentration of a source gas, a current amplitude or a voltage amplitude, and a time interval, or the like, such that ion energy over time or ion energy corresponding to an ion energy profile is generated.

Figure 5A:
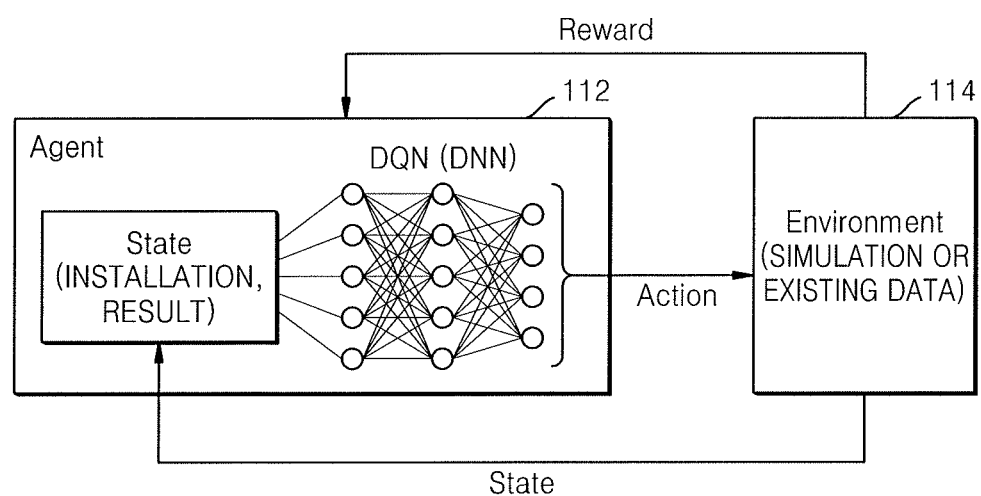
FIG. 5A illustrates reinforcement learning used in the ion depth profile control method of FIG. 1.
Figure 5B:
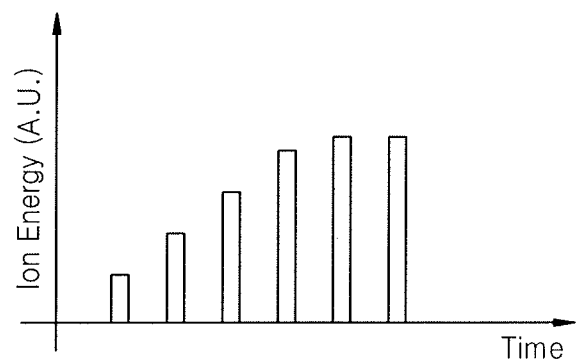
FIG. 5B illustrates a graph of an ion energy profile obtained through the reinforcement learning of FIG. 5A.

FIG. 5A illustrates reinforcement learning used in the ion depth profile control method of FIG. 1. FIG. 5B is a graph showing an ion energy profile obtained through the reinforcement learning of FIG. 5A.

Referring to FIGS. 5A and 5B, in reinforcement learning, data is not given, but an agent 112 and an environment 114 are given, and data is directly collected as the agent 112 takes certain action in the given environment 114. That is, in reinforcement learning, the agent 112 takes certain action in a current state (s), and the environment 114 returns, to the agent 112, a next state (s') and a reward (r) according to the action.

The basic components of reinforcement learning may be summarized as shown in Formula (1) below, and this type of modelling is called Markov Decision Process (MDP).

$$[S, A, R(s,s'), P(s,s'), \gamma] \qquad \text{Formula (1),}$$

where S means a set of states, A means a set of actions, R means a set of rewards, and R(s, s') is a reward obtained when transitioning from the current state (s) to the next state (s') by action (a), and P(s, s') means a transition probability of a transition from the current state (s) to the next state (s'), and γ is a discount factor determining importance of the current reward and of future reward.

Reinforcement learning aims at finding strategies that maximize reward. In stricter terms, reinforcement learning aims at expressing a strategy that determines how to act in the current state by (policy) Π and finding an optimal policy Π*. Reinforcement learning uses the concepts of state-value function and action-value function to find the optimal policy Π*.

The state value function represents the good and bad of the current state. The value of the current state is expressed by the average of the sum of the future rewards, and the importance of future reward varies according to a discount factor given between 0 and 1. The action value function represents the good and the bad of the current action, where a value of taking a certain action expected when following policy Π in a certain state is expressed as the average of the sum of future rewards, and the importance of future rewards may also vary according to a discount factor. Ultimately, the action value function quantitatively expresses the value of an action taken in the current state.

As described above, reinforcement learning aims at finding an optimal policy Π* through a state value function and an action value function. To find an optimal policy Π* by using a state value function, model information about the environment 114, i.e., information about transition probabilities and reward therefor are to be known. In contrast, according to the method of using an action value function, despite the absence of model information about the environment 114, a process in which the agent 112 takes action in the given environment 114 and finds an optimal policy Π* based on the actual experience or data obtained by taking the action may be performed. Hereinafter, only the method of using an action value function will be regarded as reinforcement learning and described.

Examples of algorithms for finding an appropriate action value function in reinforcement learning include SARSA, Q-Learning, and Policy Gradient. The most representative algorithm among them is Q-Learning. In Q-Learning, Q(s, a) represents an action value function value about an action (a) taken in a current state (s). In Q-Learning, Q(s, a) is initialized to an arbitrary value, and then, as learning progresses, Q(s, a) is repeatedly updated to find an optimal action value function value Q*(s, a). For example, Q(s, a) may be represented by the formula Q(s, a)=r'+γ$\max_a$Q (s', a'), where r' is a reward obtained when transitioning from the current state (s) to the next state (s'), and γ is a discount factor, and $\max_a$Q(s', a') may indicate a maximum value from among action value function values that may be obtained in the next state (s'). By repeating the above formula, Q(s, a) converges to Q*(s, a).

In a typical Q-Learning method, a method of generating a Q-Table of states and actions and continuously updating this table is used. However, the typical Q-Learning method may not be suitable for solving complex problems since numbers that are near infinite cases have to be updated as available states increase.

Thus, in order to solve this drawback, a Q-Networks technique in which the Q-Table is not updated but current states are received as input values and an artificial neural network (ANN) for predicting action value function values about each of actions that may be taken in the current state, i.e., Q(s, a) is generated, has been suggested. In learning by Q-Networks, target data is designated as an optimal action value function value Q*(s, a) obtained by a Q-Learning algorithm, and a state is received and a loss function is defined by a mean square error (MSE) between Q(s, a) predicted by the neural network and target data, that is, Q*(s, a) to thereby conduct optimization.

DQN is also an artificial neural network structure for reinforcement learning, which is a combination of the above-described Q-Networks and deep learning. DQN may improve the following two things in Q-Networks. First, while conventional Q-Networks uses an ANN structure of a shallow layer, DQN uses a DNN structure of a deep layer. Second, inspired by the human hippocampus, a technique referred to as Replay Memory is used, and accordingly, efficient reinforcement learning is possible. A method of operating the DQN, in particular, the DNN, will be described in more detail later with reference to FIG. 6.

With reference to the ion depth profile control method of FIG. 1, a method of using reinforcement learning is described. First, the agent 112 searches for an action (a) corresponding to a current state (s) through DQN. The agent 112 may find the action (a) corresponding to the optimal action value function value Q*(s, a) through the DQN algorithm by using the states as input values. The state may include data about the installation and result data. For example, the data about the installation may be a temperature of the ion implantation device, the usage time of the ion implantation device, or the like. The result data may be an ion depth profile and a cumulative ion depth profile. The data about the installation and the result data not limited to the above items. An action may be process conditions whereby an ion depth profile is made to substantially match a box profile. For example, the process conditions may be ion energy over time, an angle of incidence of ions over time, a dose of ions over time, a vertical movement speed of a wafer over time, and the like. The process conditions are not limited to the above items.

When an action is input to the environment 114 by the agent 112, the environment 114 gives back a next state and reward to the agent 112 by using simulation or existing data. In other words, an input action may be simulated to calculate a next state and reward, or the next state and reward related to the input action may be found from the existing data.

In more detail with reference to the ion depth profile control method of the present embodiment, when ion energy over time is input as an action, a next state corresponding thereto is calculated through simulation. The next state may be, e.g., data for the installation and an ion depth profile and a cumulative ion depth profile, which are derived when performing an ion implantation process with input ion energy over time. Meanwhile, data on the next state corresponding to a time when performing an ion implantation process with the input ion energy over time may be already included in the existing data. In that case, the next state may be extracted from the existing data rather than through simulation.

A reward may be how similar the ion depth profile calculated as the next state is to a box profile, i.e., a similarity between the ion depth profile and the box profile, which is a target profile. Reward may also be calculated by simulation or may be extracted by using existing data.

Reinforcement learning may be performed until reward is equal to or above a set criterion. For example, reinforcement learning may be performed until a similarity between an ion depth profile and a box profile, which is a target profile, is equal to or higher than a set criterion. In addition, when reinforcement learning is completed, the action of the agent 112 at that time may be extracted as a result value. For example, according to the ion depth profile control method of the present embodiment, ion energy over time may be an action of the agent 112, and thus, ion energy over time corresponding to when reinforcement learning is completed may be extracted as a resultant value of the reinforcement learning. In FIG. 5B, as a resultant value of reinforcement learning, the action of the agent 112, i.e., ion energy over time, is shown as a graph. That is, the graph of FIG. 5B is a graph of an ion energy profile indicating magnitude of ion energy over time.

Figure 6:
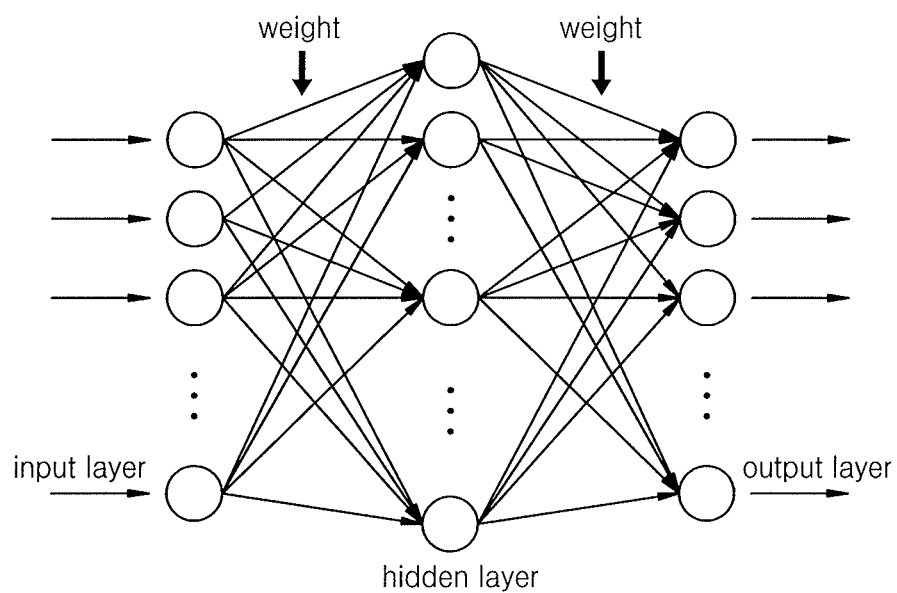
FIG. 6 illustrates a Deep Neural Network (DNN) algorithm used in the reinforcement learning of FIG. 5A.

FIG. 6 illustrates a DNN algorithm used in the reinforcement learning of FIG. 5A.

Referring to FIG. 6, DNN may include at least one hidden layer between an input layer and an output layer. Like typical artificial neural networks (ANN), the DNN may model complicated non-linear relationships. In DNN, complicated data may be modelled by using fewer units or nodes than an ANN conducted in a similar manner.

Representative operating methods of a neural network are feed-forward network (FFN), backpropagation, and recurrent neural network (RNN). FFN is a neural network in which information flows from an input layer to a hidden layer and from the hidden layer to an output layer, and here, it is impossible to adjust weights regarding errors. In backpropagation, a weight corresponding to when transitioning from each node to a next node may be adjusted to reduce errors in a result (a difference between an actual value and a resultant value), and also, returning to a previous step to adjust a weight is possible. In RNN, output layer nodes may be generated through exchange with hidden layer nodes through a part called a context unit.

In DNN, every variable is analyzed regardless of whether a continuous variable or a categorical variable, and nonlinear combination between input variables is possible. Also, in DNN, feature extraction is automatically performed, thus reducing the burden of selecting variables. Furthermore, performance of DNN improves continuously as the amount of data increases. Meanwhile, DNN takes long time when a neural network is complicated, and thus, a GPU-installed computer and a computer of high specifications are required. In addition, as variables are not put in a certain order or method during analysis, results are not uniform, and it is difficult to interpret the meaning of weights, and thus also difficult to interpret the result.

Accuracy of a neural network model depends on how weights are adjusted. As described above, backpropagation is a representative supervised learning algorithm used in training a feed-forward neural network having labeled training data and several hidden layers. That is, to put it simply, backpropagation consists of a forward phase and a backward phase, and the algorithm sequentially passes from an input layer to a hidden layer and then to an output layer, and then weights are adjusted by sequentially passing again the output layer to the hidden layer and to the input layer, and a best result is drawn by continuously repeating this process. A forward phase refers to a method of applying a weight and an activation function of each neuron while sequentially activating from an input layer to an output layer. A backward phase refers to a method of comparing a result signal generated in a forward phase with an actual target value of train data and modifying a weight between neurons by using a gradient descent method when an output signal of a network differs from an actual value.

The gradient descent method refers to a method of modifying a weight to reduce the error as much as possible, and the error may be minimized by adjusting a weight by using the gradient descent method. Meanwhile, the concept of a learning rate is used in the gradient descent method. When a too high learning rate is given, a skipping width is great. That is, even before reaching a convergence, due to the high learning rate, the convergence may be ignored and the error may increase again. When loss due to a learning rate and epoch is estimated in reality, it is found that loss increases as the learning rate increases. That is, due to a high learning rate, an optimal value is passed by, and wrong values may be continuously searched for. Meanwhile, an epoch is a factor deciding the number of times of a circulation process when modeling a DNN. The epoch is also referred to as a circulation period, and if an epoch has a too high value, the process time takes too long.

An activation function of a hidden layer is needed to apply nonlinearity to a network. An activation function is applied to each neuron (node) in the network, and the result is passed to a next neuron in the network. While most nonlinear functions may be used, a sigmoid function is frequently used. Recently, a Rectified Linear Unit (ReLU) function has been frequently used.

The entire learning process of the DNN algorithm may be described as processes of network initialization, feed forward, error estimation, propagation, and adjustment. The network initialization is setting of an initial value of a network weight, where the network weight is generally randomly initialized. The feed forward refers to transferring information from an input layer to a hidden layer and to an output layer through a network while applying an activation function and a weight, and a sigmoid function or a ReLU function may be applied as the activation function. In the error evaluation, a prediction result calculated in the network is compared with an actual result, and the algorithm ends when an error between the two results is smaller than a preset criterion. Propagation uses the error of the output layer again in weight adjustment, and the algorithm may propagate the error in an opposite direction in the network and calculate a slope of a variation in an error value with respect to a weight change. Adjustment is done by adjusting a weight by using a variation in the slope in order to reduce the error. A weight and bias of each neuron may be adjusted by factors such as a derivative of an activation function, a difference between the neural network results and the actual results, and the neuron results.

In regard to the ion depth profile control method of the present embodiment, a learning rate and epoch in the DNN algorithm may be manually or automatically set via the first UI (see 130 of FIG. 3). According to the settings of the learning rate and the epoch as described above, a learning execution time may vary. For example, when a high learning rate and a small epoch are set to reduce the learning execution time, a result value of reinforcement learning may not be accurate or no result value may be obtained at all. In contrast, when a low learning rate and a high epoch are set, it may take too long to obtain a result. Thus, by appropriately adjusting a learning rate and epoch via the first UI 130, an appropriate balance between the accuracy of a result value and the execution time may be achieved. In addition, a discount factor used in an action value function value Q in reinforcement learning may be set via the first UI 130.

Figure 7A:
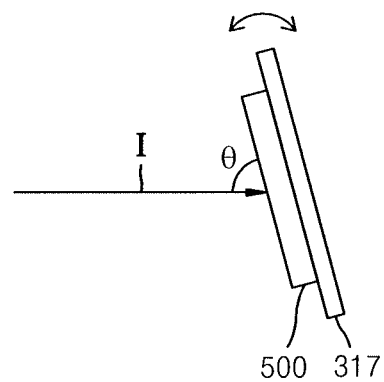
FIG. 7A illustrates an angle of incidence of ions in an ion implantation process.
Figure 7B:
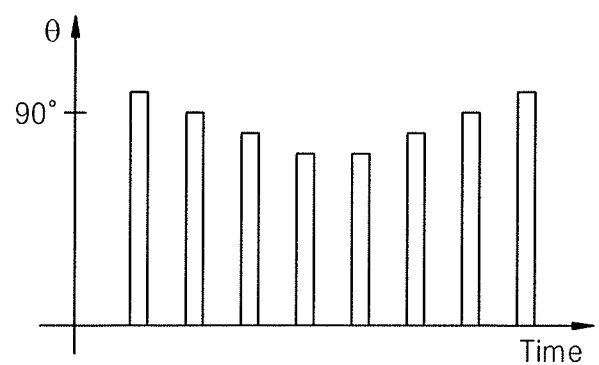
FIG. 7B illustrates a graph of an ion incidence angle profile obtained through the reinforcement learning of FIG. 5A.

FIG. 7A illustrates an angle of incidence of ions in an ion implantation process, and FIG. 7B is a graph showing an ion incidence angle profile obtained through the reinforcement learning of FIG. 5A. Descriptions already provided in the description with reference to FIGS. 1 through 6 will be only briefly described or omitted.

Referring to FIGS. 7A and 7B, in an ion implantation process, a depth at which ions I are implanted into a wafer 500 may vary according to an angle $\theta$ of incidence of the ions I incident on the wafer 500. This may be due to a lattice structure of the atoms constituting the wafer 500. Here, the angle $\theta$ of incidence may be defined as an angle between a direction in which the ions I proceed and an upper surface of the wafer 500. Thus, in an ion implantation process, the angle $\theta$ of incidence of the ions I may affect an ion depth profile.

In the ion depth profile control method of the present embodiment, the angle $\theta$ of incidence of the ions I over time may be obtained through reinforcement learning. In other words, as a process condition in the ion implantation process, the angle $\theta$ of incidence of the ions I over time may be obtained by using substantially the same method as the previous method of obtaining ion energy over time, obtained through reinforcement learning.

For example, in reinforcement learning, the agent 112 calculates the angle θ of incidence of the ions I over time through the DQN algorithm and inputs the same as an action into the environment 114, and the environment 114 returns, as a reward, a similarity between an ion depth profile and a box profile to the agent 112. In the reinforcement learning, when the similarity is equal to or greater than a set criterion, the angle θ of incidence of the ions I over time may be obtained as a result value of the reinforcement learning.

Meanwhile, the angle θ of incidence of the ions I over time may be represented by a graph of the ion incidence angle profile, as shown in FIG. 7B. The graph of the ion incidence angle profile in FIG. 7B indicates the angle of incidence of ions over time.

Figure 8A:
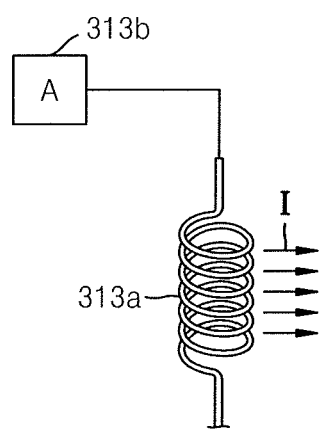
FIG. 8A illustrates adjustment of an ion dose in an ion implantation process.
Figure 8B:
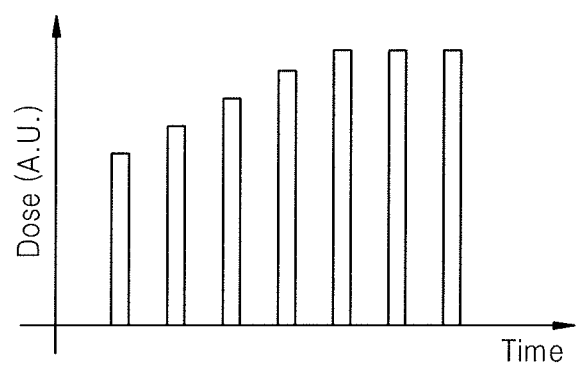
FIG. 8B illustrates a graph of an ion dose profile obtained through the reinforcement learning of FIG. 5A.

FIG. 8A illustrates adjustment of an ion dose in an ion implantation process, and FIG. 8B is a graph showing an ion dose profile obtained through the reinforcement learning of FIG. 5A. Descriptions already provided in the description with reference to FIGS. 1 through 6 will be only briefly described or omitted.

Referring to FIGS. 8A and 8B, in an ion implantation process, a depth at which ions I are implanted into a wafer may vary according to an amount of the ions I implanted into the wafer. This is because a repulsive force affecting the ions I on each other and scattering of the ions I in the wafer may increase according to the amount of the ions I. As described above, the amount, e.g., number, of implanted ions I may be referred to as a dose of ions or a current of an ion beam. In addition, an ion dose may be adjusted by adjusting a current flowing through the ion generator 313a by using the current source 313b. Thus, in an ion implantation process, the dose of the ions I may affect an ion depth profile.

In the ion depth profile control method of the present embodiment, the dose of the ions I over time may be obtained through reinforcement learning. In other words, as a process conditions in the ion implantation process, the dose of the ions I over time may be obtained by using a substantially same method as the previous method of obtaining ion energy over time, obtained through reinforcement learning. For example, in reinforcement learning, the agent 112 calculates the dose of the ions I over time through the DQN algorithm and inputs the same as an action into the environment 114, and the environment 114 returns, as a reward, a similarity between an ion depth profile and a box profile to the agent 112. In the reinforcement learning, when the similarity is equal to or greater than a set criterion, the dose of the ions I over time may be obtained as a result value of the reinforcement learning.

Meanwhile, the dose of the ions I over time may be represented by a graph of the ion dose profile, as shown in FIG. 8B. The graph of the ion dose profile in FIG. 8B indicates the ion dose over time.

Figure 9A:
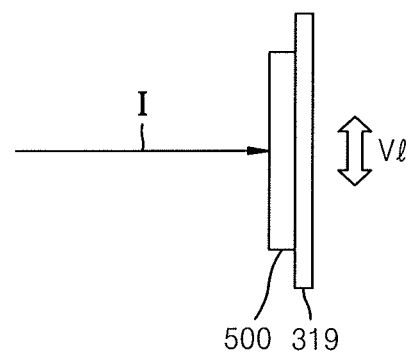
FIG. 9A illustrates a vertical movement speed of a wafer in an ion implantation process.
Figure 9B:
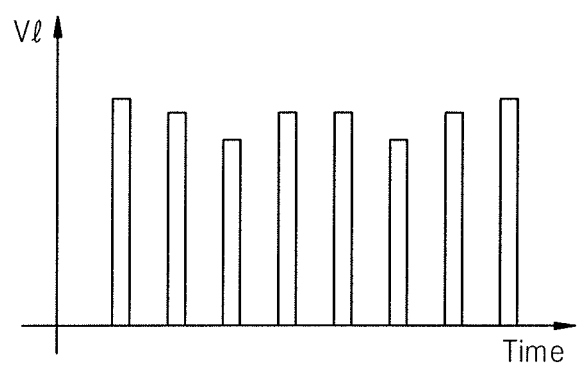
FIG. 9B illustrates a graph of a vertical movement speed profile of a wafer obtained through the reinforcement learning of FIG. 5A.

FIG. 9A illustrates a vertical movement speed of a wafer in an ion implantation process, and FIG. 9B is a graph showing a vertical movement speed profile of a wafer obtained through the reinforcement learning of FIG. 5A. Descriptions already provided in the description with reference to FIGS. 1 through 6 will be only briefly described or omitted.

Referring to FIGS. 9A and 9B, in an ion implantation process, a depth at which ions I are implanted into a wafer 500 may vary according to a vertical movement speed V1 of the wafer 500. This is because variability of a portion of the wafer 500 affected by a phase difference of the ions I increases according to the vertical movement speed V1 of the wafer 500. As described above, as the wafer 500 is moved in a vertical direction by the stage 319, the vertical movement speed V1 of the wafer 500 may be adjusted using the stage 319. Thus, in an ion implantation process, the vertical movement speed V1 of the wafer 500 over time may affect an ion depth profile.

In the ion depth profile control method of the present embodiment, the vertical movement speed V1 of the wafer 500 over time may be obtained through reinforcement learning. In other words, as a process condition in the ion implantation process, the vertical movement speed V1 of the wafer 500 over time may be obtained by using a substantially same method as the previous method of obtaining ion energy over time, obtained through reinforcement learning. For example, in reinforcement learning, the agent 112 calculates the vertical movement speed V1 of the wafer 500 over time through the DQN algorithm and inputs the same as an action into the environment 114, and the environment 114 returns, as a reward, a similarity between an ion depth profile and a box profile to the agent 112. In the reinforcement learning, when the similarity is equal to or greater than a set criterion, the vertical movement speed V1 of the wafer 500 over time may be obtained as a result of the reinforcement learning.

Meanwhile, the vertical movement speed V1 of the wafer 500 over time may be represented by a graph of the vertical movement speed, as shown in FIG. 9B. In the graph of the vertical movement speed profile of FIG. 9B, a vertical movement speed of a wafer is indicated over time.

Figure 10A:
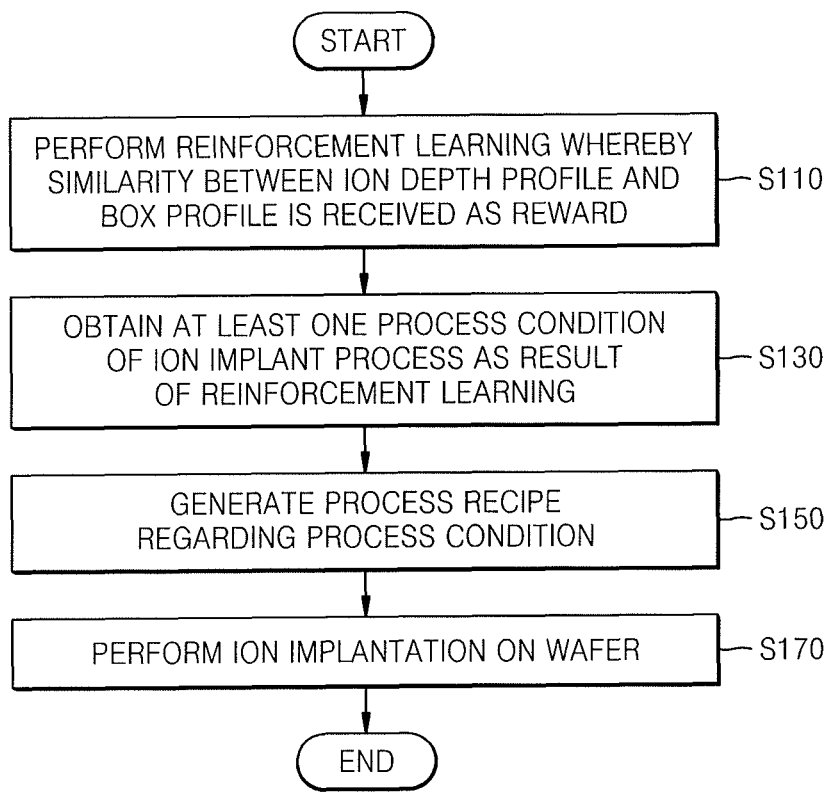
FIG. 10A illustrates a flowchart of an ion implantation method according to an embodiment.

FIG. 10A is a flowchart of an ion implantation method according to an embodiment. Descriptions already provided in the description with reference to FIGS. 1 through 9B will be only briefly described or omitted.

Referring to FIG. 10A, first, as described with reference to the ion depth profile control method of FIG. 1, performing reinforcement learning (S110), obtaining at least one process condition (S130), and generating a process recipe (S150) are sequentially performed. While the description with reference to FIG. 1 is focused on obtaining ion energy over time as the at least one process condition through reinforcement learning, embodiments are not limited thereto, and the angle of incidence of ions I over time, the dose of the ions I over time, the vertical movement speed of the wafer 500 or the like may also be obtained as at least one process condition through reinforcement learning, which are described above with reference to FIGS. 7A through 9B.

After generating the process recipe (S150), the process recipe is applied to perform an ion implantation on a wafer (S170). Performing ion implantation (S170) may be performed through several operations as described below with reference to FIG. 10B. However, according to embodiments, an ion implantation may be performed directly on a device wafer. In operation of performing an ion implantation (S170), the wafer may be a concept encompassing a test wafer and a device wafer. A test wafer may be a wafer used to test whether a process condition obtained through reinforcement learning and a process recipe according to the process condition are appropriate to implement an ion depth profile in the form of a box profile. Thus, from a test wafer, no semiconductor device may be manufactured. A device wafer is a wafer from which a semiconductor device is manufactured, and various semiconductor processes may be performed thereon after an ion implantation process.

Figure 10B:
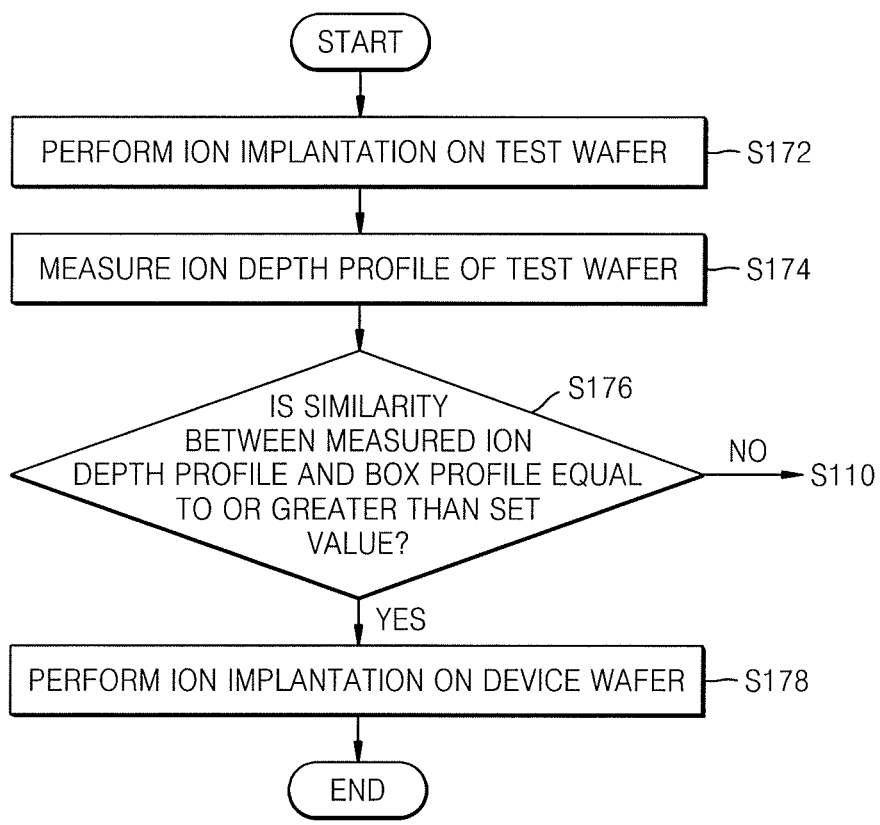
FIG. 10B illustrates a detailed flowchart of an operation of performing ion implantation in FIG. 10A.

FIG. 10B is a detailed flowchart of the operation of performing ion implantation of FIG. 10A. The operation will be described also with reference to FIG. 10A, and descriptions already provided in the description with reference to FIG. 10A will be only briefly described or omitted.

Referring to FIG. 10B, the operation of performing an ion implantation (S170) includes performing an ion implantation on a test wafer (S172) by applying the process recipe generated in operation S150 of generating the process recipe. As described above, the test wafer may be a wafer to test whether a process condition obtained through reinforcement learning and a process recipe according to the process condition are appropriate.

Next, an ion depth profile of the test wafer is measured (S174). Next, by comparing a box profile, which is a target profile, and the ion depth profile obtained through measurement, whether a similarity is equal to or greater than a set value is determined (S176).

When the similarity is equal to or greater than the set value (Yes), an ion implantation is performed on a device wafer (S178). As described above, the device wafer may be a wafer from which an actual semiconductor device is manufactured.

When the similarity is less than the set value (No), the method returns to performing reinforcement learning (S110). To obtain a new process condition and a process recipe according to the same, variables used in reinforcement learning may be modified. For example, variables such as a discount factor, a learning rate, an epoch or the like in reinforcement learning may be modified. However, the variables to be modified are not limited to the above-described items.

Figure 11:
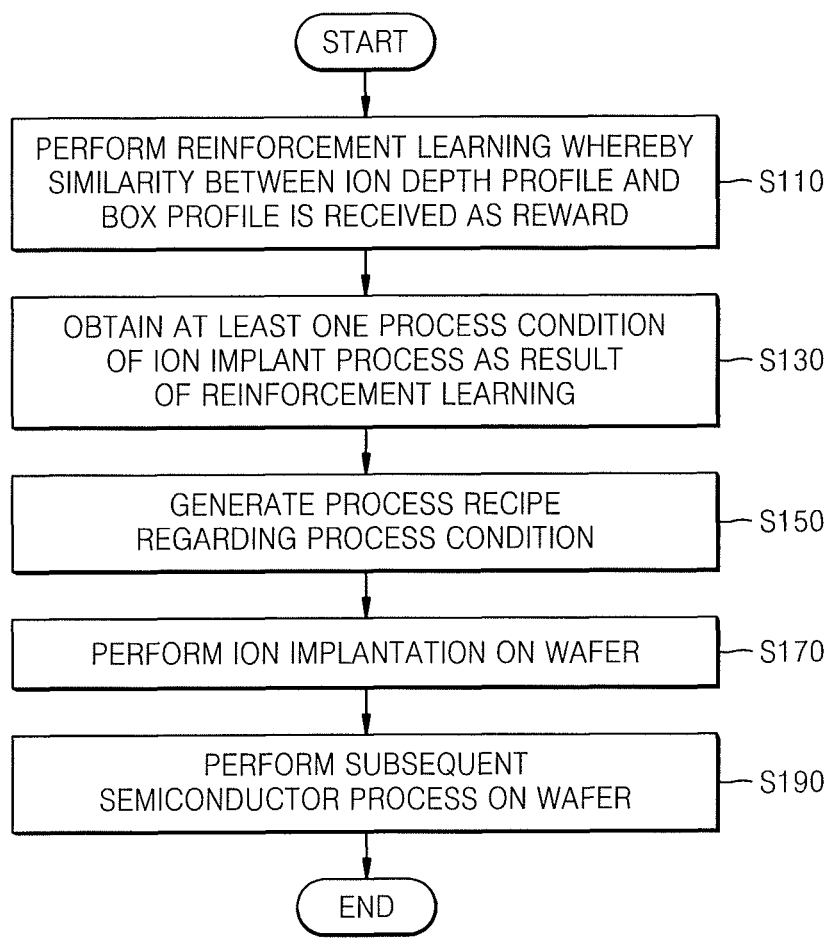
FIG. 11 illustrates a flowchart of a manufacturing method of a semiconductor device according to an embodiment.

FIG. 11 is a flowchart of a manufacturing method of a semiconductor device, according to an embodiment. Descriptions already provided in the description with reference to FIGS. 1 through 10B will be only briefly described or omitted.

Referring to FIG. 11, first, as described with reference to the ion implantation method of FIG. 10A, performing reinforcement learning (S110), obtaining at least one process condition (S130), generating a process recipe (S150), and performing an ion implantation on a wafer (S170) are sequentially performed. Operation of performing an ion implantation on a wafer (S170) may include various processes as described with reference to FIG. 10B. However, in the method of manufacturing a semiconductor device, according to the present embodiment, a wafer in operation S170 of performing an ion implantation on a wafer may refer to a device wafer from which an actual semiconductor device is manufactured.

After performing an ion implantation on the wafer, a subsequent semiconductor process is performed on the wafer (S190). A plurality of semiconductor devices may be manufactured from the wafer through the subsequent semiconductor process on the wafer. The subsequent semiconductor process on the wafer may include various processes. For example, the subsequent semiconductor process on the wafer may include a deposition process, an etching process, an ion process, a cleaning process, and the like. Also, the subsequent semiconductor process on the wafer may include a test process of a semiconductor device on a wafer level. Furthermore, the subsequent semiconductor process on the wafer may include an operation of singulating the wafer into semiconductor chips and an operation of packaging the semiconductor chips.

In detail, when semiconductor chips are completed in the wafer through the semiconductor processes described above such as the deposition process, the etching process, the ion process, and the cleaning process, the wafer may be singulated into each semiconductor chip. The singulation into semiconductor chips may be performed by a sawing process by using a blade or a laser. Next, a packaging process may be performed on the semiconductor chips. The packaging process may refer to a process of mounting semiconductor chips on a printed circuit board (PCB) and sealing the semiconductor chips by using a sealing material. Meanwhile, the packaging process may include forming a stack package by stacking multiple semiconductors on a PCB in multiple layers or forming a package on package (POP) structure by stacking a stack package on another stack package. A semiconductor device or a semiconductor package may be completed through a packaging process of semiconductor chips. Meanwhile, after the packaging process, a test process may be performed on the semiconductor package.

By way of summation and review, embodiments provide an ion depth profile control method in which an ion depth profile is converted to a box profile through a single process, an ion implantation method and a semiconductor device manufacturing method based on the control method, and an ion implantation system adapting the control method. That is, according to the present depth profile controlling method of an ion implant installation, reinforced learning is used to generate a profile of a process condition, e.g., ion energy over time, for generating a box profile of ion concentration relative to wafer depth in a single process step. Thus, by implementing the box profile by the single process step, a more precise box profile than that in a comparative art is obtained.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

The various operations of methods described above may be performed by any suitable means capable of performing the operations, such as various hardware and/or software component(s), controllers, circuits, and/or module(s). The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An ion depth profile control method, comprising:
   performing reinforcement learning, whereby a similarity between an ion depth profile and a box profile is output as a reward when the similarity is equal to or greater than a set criterion, the ion depth profile being an ion concentration according to a wafer depth in an ion implantation process, and the box profile being a target profile;
   obtaining at least one process condition of the ion implantation process as a result of the reinforcement learning; and
   generating a process recipe regarding the at least one process condition.

2. The ion depth profile control method as claimed in claim 1, wherein the at least one process condition includes ion energy over time in the ion implantation process.

3. The ion depth profile control method as claimed in claim 1, wherein:
   an agent and an environment are provided in the reinforcement learning, and
   when the agent takes action A in a current state, the environment returns, to the agent, a next state according to action A and the reward, and
   the agent generates action A through a learning algorithm based on information about the current state.

4. The ion depth profile control method as claimed in claim 3, wherein:
   the current state includes at least one of a state of installation, an ion depth profile, and a cumulative ion depth profile, and
   the at least one process condition includes ion energy over time in the ion implantation process.

5. The ion depth profile control method as claimed in claim 4, wherein:
   the learning algorithm includes a Deep Neural Network (DNN) algorithm, and
   a learning rate is set and a learning progress state is debugged via a user interface (UI).

6. An ion implantation method, comprising:
   performing reinforcement learning, whereby a similarity between an ion depth profile and a box profile is output as a reward when the similarity is equal to or greater than a set criterion, the ion depth profile being an ion concentration according to a wafer depth in an ion implantation process, and the box profile being a target profile;
   obtaining at least one process condition of the ion implantation process as a result of the reinforcement learning;
   generating a process recipe regarding the at least one process condition; and
   performing ion implantation on a wafer by applying the process recipe.

7. The ion implantation method as claimed in claim 6, wherein:
   the at least one process condition is ion energy over time in the ion implantation process, and
   obtaining the at least one process condition includes generating an ion energy profile indicating magnitude of ion energy over time.

8. The ion implantation method as claimed in claim 7, wherein ion implantation is performed on the wafer through a single process based on the ion energy profile.

9. The ion implantation method as claimed in claim 7, wherein:
   generating the process recipe includes generating physical quantities for implementing the ion energy profile, and
   performing the ion implantation includes performing the ion implantation while modifying ion energy in real time by using the process recipe based on the ion energy profile.

10. The ion implantation method as claimed in claim 6, wherein:
    the at least one process condition is an angle of incidence of ions with respect to the wafer over time in the ion implantation process,
    obtaining the at least one process condition includes generating an ion incidence angle profile indicating an angle of incidence of ions over time, and
    performing the ion implantation includes performing the ion implantation while modifying an angle of the wafer in real time based on the ion incidence angle profile.

11. The ion implantation method as claimed in claim 6, wherein:
    an agent and an environment are provided in the reinforcement learning,
    when the agent takes action A in a current state, the environment returns, to the agent, a next state according to action A and the reward,
    the agent generates action A through a learning algorithm based on information about the current state, and
    the at least one process condition includes ion energy over time in the ion implantation process.

12. The ion implantation method as claimed in claim 6, wherein performing the ion implantation includes:
    performing ion implantation on a test wafer by using the process recipe;
    measuring an ion depth profile of the test wafer;
    determining a similarity between the ion depth profile of the test wafer and the box profile; and
    when the similarity is equal to or greater than a set value, performing the ion implantation on a device wafer.

13. The ion implantation method as claimed in claim 12, wherein, when the similarity is less than the set value, the reinforcement learning is performed, and variables used in the reinforcement learning are modified.

14. The ion implantation method as claimed in claim 6, wherein at least one of performing reinforcement learning, obtaining at least one process condition, and performing ion implantation is controlled automatically or manually via a user interface (UI).

15. The ion implantation method as claimed in claim 14, wherein performing reinforcement learning includes setting a learning rate and debugging a learning progress state via the UI.

16. A method of manufacturing a semiconductor device, the method comprising:
    performing reinforcement learning, whereby a similarity between an ion depth profile and a box profile is output as a reward when the similarity is equal to or greater than a set criterion, the ion depth profile being an ion concentration according to a wafer depth in an ion implantation process, and the box profile being a target profile;
    obtaining at least one process condition of the ion implantation process as a result of the reinforcement learning;

generating a process recipe regarding the at least one process condition;

performing ion implantation on a wafer by applying the process recipe; and performing a subsequent semiconductor process on the wafer.

17. The method as claimed in claim 16, wherein:

an agent and an environment are provided in the reinforcement learning, and when the agent takes action A in a current state, the environment returns, to the agent, a next state according to action A and the reward, and the agent generates action A through a learning algorithm based on information about the current state, and wherein the at least one process condition includes ion energy over time in the ion implantation process.

18. The method as claimed in claim 17, wherein:

the learning algorithm includes a Deep Neural Network (DNN) algorithm, and a learning rate is set, a learning progress state is debugged, and the ion energy over time is set via a user interface (UI).

19. The method as claimed in claim 16, wherein:

obtaining the at least one process condition includes generating an ion energy profile indicating magnitude of ion energy over time, and performing ion implantation is performed on the wafer through a single process based on the ion energy profile.

20. The method as claimed in claim 16, wherein:

obtaining the at least one process condition includes generating an ion energy profile indicating magnitude of ion energy over time, generating the process recipe includes generating physical quantities for implementing the ion energy profile, and performing the ion implantation includes performing the ion implantation while modifying ion energy in real time by using the process recipe based on the ion energy profile.

\* \* \* \* \*